United States Patent
White

(10) Patent No.: US 7,476,289 B2
(45) Date of Patent: Jan. 13, 2009

(54) VACUUM ELASTOMER BONDING APPARATUS AND METHOD

(75) Inventor: John M. White, Hayward, CA (US)

(73) Assignee: Applied Materials, Inc., SAnta Clara, CA (US)

(*) Notice: Subject to any disclaimer, the term of this patent is extended or adjusted under 35 U.S.C. 154(b) by 159 days.

(21) Appl. No.: 11/478,280

(22) Filed: Jun. 29, 2006

(65) Prior Publication Data

US 2008/0000770 A1    Jan. 3, 2008

(51) Int. Cl.
- B29C 65/00 (2006.01)
- B32B 37/00 (2006.01)
- B30B 5/02 (2006.01)
- B30B 15/06 (2006.01)
- B30B 15/34 (2006.01)
- C23C 14/00 (2006.01)

(52) U.S. Cl. .............. 156/286; 156/285; 156/381; 156/382; 156/583.1; 100/211; 204/298.12

(58) Field of Classification Search .......... 100/211; 156/382, 381, 583.1; 204/298.12
See application file for complete search history.

(56) References Cited

U.S. PATENT DOCUMENTS

| | | | |
|---|---|---|---|
| 3,950,210 A * | 4/1976 | Gibbs et al. | 156/367 |
| 3,958,856 A * | 5/1976 | Presson | 439/488 |
| 3,964,958 A * | 6/1976 | Johnston | 156/382 |
| 4,200,510 A * | 4/1980 | O'Connell et al. | 204/192 R |
| 4,412,980 A | 11/1983 | Tsuji et al. | |
| 4,450,034 A * | 5/1984 | Stern | 156/382 |
| 4,512,348 A | 4/1985 | Uchigaki et al. | |
| 4,918,800 A | 4/1990 | Reafler | |
| 4,922,594 A | 5/1990 | Patel et al. | |
| 4,966,646 A | 10/1990 | Zdeblick | |
| 5,041,700 A | 8/1991 | Iyogi et al. | |
| 5,375,034 A | 12/1994 | Foyt | |
| 5,381,299 A | 1/1995 | Provenzano et al. | |
| 5,448,444 A | 9/1995 | Provenzano et al. | |
| 5,693,203 A | 12/1997 | Ohhashi et al. | |
| 5,909,458 A | 6/1999 | Freitas et al. | |
| 5,952,572 A | 9/1999 | Yamashita et al. | |
| 6,062,461 A | 5/2000 | Sparks et al. | |
| 6,150,194 A | 11/2000 | Sakaguchi et al. | |
| 6,165,907 A | 12/2000 | Yoneda et al. | |
| 6,194,322 B1 * | 2/2001 | Lilleland et al. | 438/710 |
| 6,221,197 B1 | 4/2001 | Mori et al. | |
| 6,285,087 B1 | 9/2001 | Sakaguchi et al. | |
| 6,335,479 B1 | 1/2002 | Yamada et al. | |
| 6,348,507 B1 | 2/2002 | Heiler et al. | |

(Continued)

FOREIGN PATENT DOCUMENTS

EP    1 202 261    5/2002

(Continued)

*Primary Examiner*—Jeff H Aftergut
*Assistant Examiner*—Brian R Slawski
(74) *Attorney, Agent, or Firm*—Patterson & Sheridan LLP

(57) ABSTRACT

The present invention includes a method and apparatus for bonding a sputtering target to a backing plate. In one embodiment, a sputtering target is vacuum bonded to a backing plate using an elastomeric adhesive and a metal mesh. The vacuum pulls the backing plate and sputtering target together while also removing air pockets that inevitably form within the adhesive during adhesive deposition and backing plate attachment.

20 Claims, 2 Drawing Sheets

U.S. PATENT DOCUMENTS

| | | |
|---|---|---|
| 6,465,726 B2 | 10/2002 | Yamada et al. |
| 6,480,365 B1 | 11/2002 | Gill et al. |
| 6,562,127 B1 | 5/2003 | Kub et al. |
| 6,593,212 B1 | 7/2003 | Kub et al. |
| 6,604,672 B2 | 8/2003 | Mori et al. |
| 6,607,969 B1 | 8/2003 | Kub et al. |
| 6,611,546 B1 | 8/2003 | Garnache et al. |
| 6,620,282 B2 | 9/2003 | Mori et al. |
| 6,658,034 B2 | 12/2003 | Garnache et al. |
| 6,711,203 B1 | 3/2004 | Garnache et al. |
| 6,712,950 B2 | 3/2004 | Denvir et al. |
| 6,723,213 B2 | 4/2004 | Nakadai et al. |
| 6,741,629 B1 | 5/2004 | Garnache et al. |
| 6,767,749 B2 | 7/2004 | Kub et al. |
| 6,777,610 B2 | 8/2004 | Yamada et al. |
| 6,881,308 B2 | 4/2005 | Denvir et al. |
| 6,902,987 B1 | 6/2005 | Tong et al. |
| 2002/0121437 A1 | 9/2002 | Nakadai et al. |
| 2004/0027981 A1 | 2/2004 | Schoeppel |

FOREIGN PATENT DOCUMENTS

| | | |
|---|---|---|
| WO | WO 02/35526 | 5/2002 |

* cited by examiner

VACUUM ELASTOMER BONDING APPARATUS AND METHOD

BACKGROUND OF THE INVENTION

1. Field of the Invention

Embodiments of the present invention generally relate to an apparatus and methods for bonding sputtering targets to backing plates.

2. Description of the Related Art

Physical vapor deposition (PVD) using a magnetron is one method of depositing material onto a substrate. During a PVD process, a target is electrically biased so that ions generated in a process region can bombard the target surface with sufficient energy to dislodge atoms from the target. The process of biasing a target to generate a plasma that causes ions to bombard and remove atoms from the target surface is commonly called sputtering. The sputtered atoms travel generally toward the substrate and are deposited on the substrate. Alternatively, the atoms react with a gas in the plasma, for example, nitrogen, to reactively deposit a compound on the substrate. Reactive sputtering is often used to form thin barrier and nucleation layers of titanium nitride or tantalum nitride on the substrate.

PVD can be used to deposit thin films over substrates such as semiconductor wafers, glass substrates, thin film transistor (TFT) circuits, liquid crystal displays (LCDs), solar panel substrates, flat panel displays, and other suitable substrates. One problem with current PVD apparatus and methods is effectively bonding sputtering targets to backing plates. Other methods and apparatus for bonding sputtering targets to backing plates are inefficient. Therefore, there is a need for an improved apparatus and method to bond sputtering targets to backing plates.

SUMMARY OF THE INVENTION

The present invention includes a method and apparatus for bonding a sputtering target to a backing plate. In one embodiment, a sputtering target is vacuum bonded to a backing plate using an elastomeric adhesive and a metal mesh. The vacuum pulls the backing plate and sputtering target together while also removing air pockets that inevitably form within the adhesive during adhesive deposition and backing plate attachment.

In one embodiment, a method of bonding a sputtering target tile to a backing plate is disclosed. The method includes providing an elastomeric adhesive layer between the sputtering target tile and the backing plate, providing a metal mesh within the adhesive layer, and removing air pockets from the adhesive by compressing the backing plate and the at least one sputtering target tile, wherein the compressing consists of applying a vacuum.

In another embodiment, a method of bonding a sputtering target tile to a backing plate is disclosed. The method includes providing an apparatus comprising an upper chamber and a lower chamber, separated by a metal plate, placing the sputtering target tile and the backing plate within the lower chamber, evacuating the lower chamber, and venting the upper chamber to atmospheric pressure while the lower chamber is evacuated. An elastomeric adhesive is provided between the backing plate and the at least one sputtering target tile. The backing plate and the sputtering target tile are sandwiched between the metal plate and a lower chamber bottom wall as the pressure differential between the chambers urges the metal plate downwards.

In yet another embodiment, a method of bonding a sputtering target tile to a backing plate is disclosed. The method includes providing an apparatus comprising an upper chamber and a lower chamber, wherein the chambers are separated by a metal plate. A pumping system is coupled to both the upper chamber and the lower chamber. The sputtering target tile is placed in the lower chamber after applying an elastomeric adhesive to the sputtering target tile. The adhesive is degassed. Following the degassing, the backing plate is placed against the adhesive and bonding pressure is applied to the sputtering target tile and the backing plate. The upper and lower chambers are then vented to atmosphere. The pumping system is coupled to the upper chamber by a first pumping line. The first pumping line comprises a first valve. A venting line is coupled to the first pumping line at a location between the upper chamber and the first valve. The venting line comprises a second valve between the first pumping line and atmosphere. The first valve is located between the venting line and a vacuum line. The pumping system is also coupled to the lower chamber by a second pumping line. The vacuum line is coupled to the first and second pumping lines. The vacuum line comprises a third valve located between a vacuum pump and the first and second pumping lines.

In another embodiment, an apparatus is disclosed. The apparatus includes an upper chamber and a lower chamber separated by a metal plate. A pumping system is coupled to the upper chamber by a first pumping line. The first pumping line comprises a first valve. A venting line is coupled to the first pumping line at a location between the upper chamber and the first valve. The venting line comprises a second valve between the first pumping line and atmosphere. The first valve is located between the venting line and a vacuum line. The pumping system is also coupled to the lower chamber by a second pumping line. The vacuum line is coupled to the first and second pumping lines. The vacuum line comprises a third valve located between a vacuum pump and the first and second pumping lines.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide a method of bonding sputtering targets or target tiles to a backing plate using an adhesive and an apparatus suitable for performing said method. The backing plate with bonded target tiles can be cured at a relatively low temperature, such as less than about 100-150 degrees Celsius, to reduce the risk of bowing of the backing plate and the bonded target tiles. The invention can be applied to bond all sizes of sputtering targets or target tiles used for processing any type of substrate. The sputtering target bonded to a backing plate illustratively described below can be used in a physical vapor deposition system for processing large area substrates, such as a PVD system, available from AKT®, a division of Applied Materials, Inc., Santa Clara, Calif. However, it should be understood that the sputtering target bonded to a backing plate may have utility in other system configurations, including those systems configured to process round substrates, such as semiconductor substrates.

Figure 1:
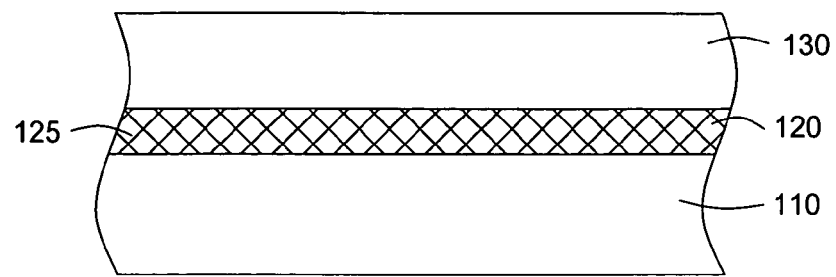
FIG. 1 is a cross sectional view of one embodiment of a sputtering target bonded to a backing plate.

FIG. 1 shows a cross section of a target (or target tile) 130 bonded to a backing plate 110 by an elastomeric adhesive 120 and a mesh 125 disposed between the target 130 and backing plate 110. The target 130 may be single piece target, target tiles welded into one piece, target tiles placed closed to one another, or welded target tiles placed close to one another. The target 130 may comprise any type of sputtering material such as aluminum, copper, gold, nickel, tin, molybdenum, chromium, zinc, palladium, stainless steel, palladium, tin, indium, titanium, tungsten, neodymium and combinations thereof, among others.

The backing plate 110 provides support for the sputtering target 130 and also provides electrical connection to a power source. The backing plate 110 may be made of conductive materials, such as aluminum, copper, gold, nickel, tin, molybdenum, chromium, zinc, palladium, stainless steel, palladium alloys, tin alloy, aluminum alloy and copper alloy, among others. In one embodiment, the backing plate material is fabricated from aluminum.

The adhesive 120 may be any suitable adhesive. In one embodiment, the adhesive 120 is an elastomeric adhesive. The elastomeric adhesives have low stress before and after curing, which is performed after the target 130 and the backing plate 110 are pressed together with the adhesive 120 between them. The adhesive 120 should also have a thermal coefficient close to the target 130 and the backing plate 110. 3M of St. Paul, Minn., Dow Chemicals of Midland, Mich., and GE Consumer Electrics of Oklahoma City, Okla., offer many types of commercial elastomers for bonding between metals. An example of an elastomeric adhesive that may be used to bond metal to metal is AF 30/EC 1660 adhesive, available from 3M. Since a sputtering process is operated under high vacuum, such as $<10^{-4}$ Torr, the elastomeric adhesive between the target 130 and the backing plate 110 must be cured prior to usage in the process chamber to prevent outgassing.

The mesh 125 may be made of any material with good electrical and/or thermal conductivities, such as copper, aluminum, copper alloy, and aluminum alloy. The mesh 125 provides electrical and/or thermal conductive paths between the target 130 and the backing plate 110. One or more meshes 125 may be stacked between the target 130 and the backing plate 110.

Figure 2:
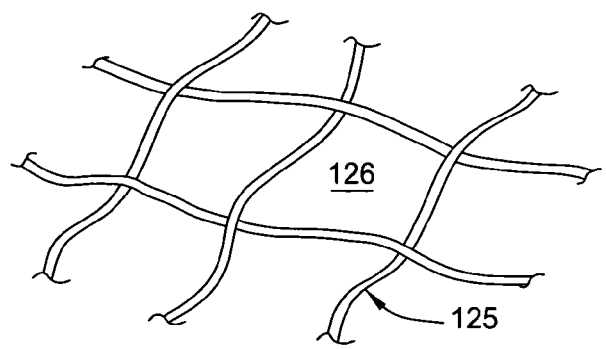
FIG. 2 is a perspective view of one embodiment of a metal mesh used in the present invention.

FIG. 2 shows a perspective view of one embodiment of the mesh 125, which is made of overlapping metal wires. The metal wires of the mesh 125 may be arranged in various fashions. The openings 126 in the mesh 125 are large enough to let the adhesive 120 pass through, which ensures the mesh 125 has good contact with the target 130 and the backing plate 110 and allows the adhesive 120 to spread into a uniform layer between the target 130 and the backing plate 110.

In one embodiment, the percentage of the total surface area of openings 126 in the mesh 125 to the total bonding surface area is between about 35 percent to about 90 percent. In another embodiment, the percentage is between about 40 percent to about 70 percent. In yet another embodiment, the percentage is between about 55 percent to about 65 percent. If the percentage of the total surface area of the openings 126 is too low, the adhesive will not readily flow through the mesh 125 and may prevent the mesh 125 from uniformly contacting the target and/or backing plate. Uniform electrical and/or thermal contact provided between the target 130 and the backing plate 110 by the mesh 125 contributes to uniform and repeatable processing results. In one embodiment, the diameter of the metal wires used to make the mesh 125 is at least 0.5 mm. In another embodiment, the wire diameter is at least 0.8 mm.

The adhesive 120 is combined with the mesh 125 to provide good thermal conductivity between the target 130 and the backing plate 110 and ensures the target 130 is properly cooled by a cooling medium (not shown) flowing through the backing plate 110 during a sputtering process. The thermal conductivity can come from the mesh 125. Alternatively, the adhesive 120 could include powder, such as silver powder or diamond powder, in the weight range between about 0 percent to about 80 percent to increase thermal conductivity. U.S. patent application Ser. No. 11/368,000, filed Mar. 3, 2006, which is hereby incorporated by reference in its entirety, discusses an exemplary manner in which diamond powder can be incorporated into the adhesive.

Figure 3:
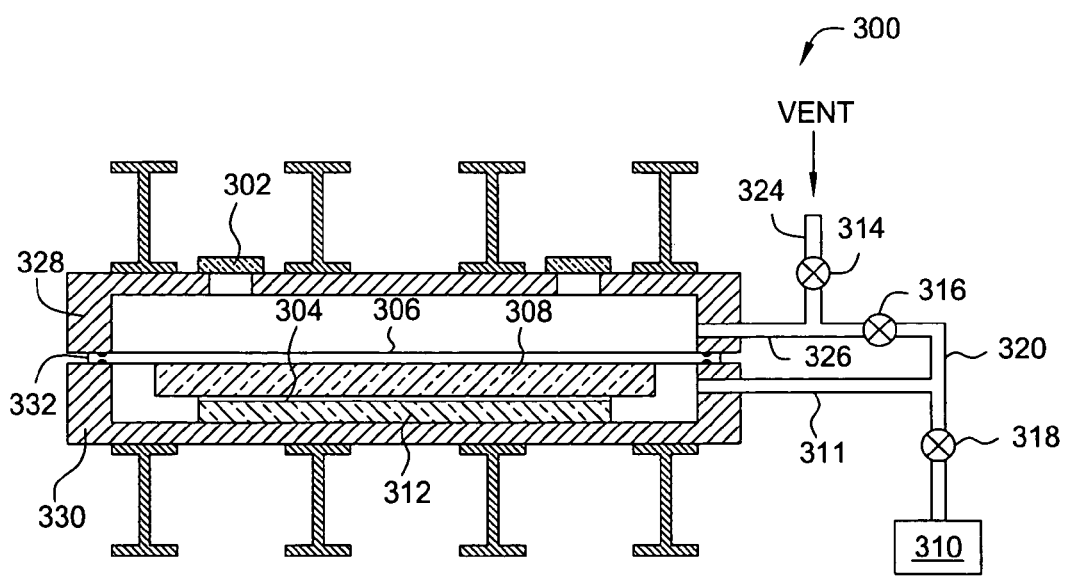
FIG. 3 is a schematic view of the apparatus of the present invention.

FIG. 3 shows one embodiment of an apparatus 300 that can be used to bond the sputtering target 312 and backing plate 308. The apparatus 300 includes an upper chamber 328 and a lower chamber 330. The sputtering target 312, backing plate 308, and metal mesh/adhesive combination 304 are placed into the lower chamber 330. A metal plate 306 and O-rings 332 isolate the upper chamber 328 from the lower chamber 330. The metal plate 306 can be made of any durable sheet metal such as stainless steel or steel.

Both the upper chamber 328 and lower chamber 330 may be selectively connected to vacuum or vented to atmosphere. A pumping line 326 is coupled to the upper chamber 328. Along the pumping line 326 is a valve 316. Also along the pumping line 326, a venting line 324 branches off. The venting line 324 includes a valve 314. When the valve 314 is opened, the venting line 324 is open to atmosphere. A pumping line 311 is also connected to the lower chamber 330. A vacuum line 320 is coupled to both pumping lines 311, 326. The vacuum line 320 is coupled to a vacuum pump 310. A valve 318 is provided between the vacuum pump 310 and the pumping lines 311, 326 along the vacuum line 320. When valve 318 is opened, a vacuum can be drawn through the lines 320, 311, 326 by the vacuum pump 310. As the upper chamber 328 vents to atmosphere, the pressure differential between the upper chamber 328 and lower chambers 330 increases, the metal plate 306 compresses 312 and backing plate 308 together.

Figure 4:
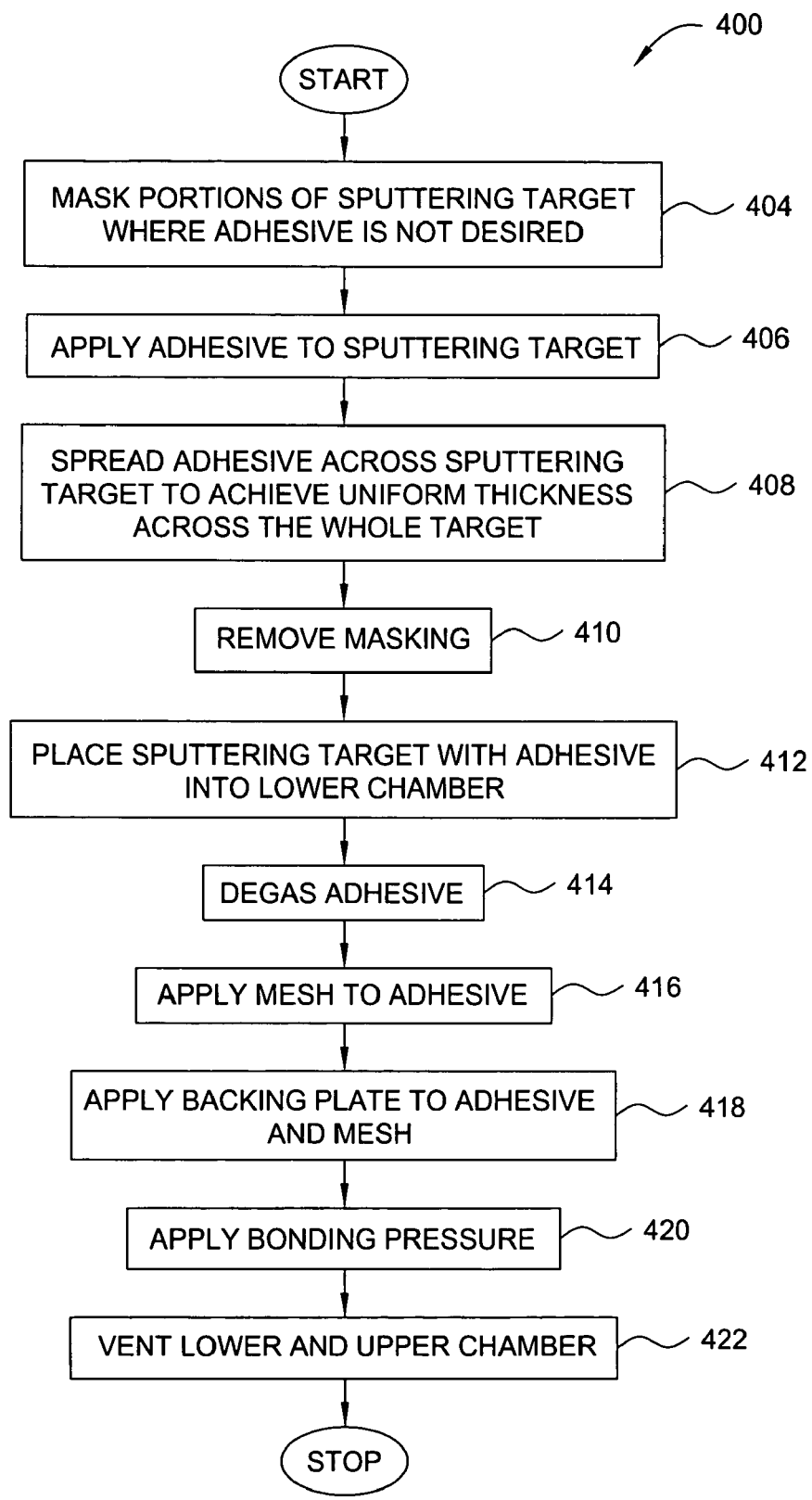
FIG. 4 is a flow chart of one embodiment of a process for bonding a backing plate to a sputtering target.

FIG. 4 is a flow chart 400 illustrating one embodiment of a process for bonding the target 312 to the backing plate 308. The bonding process proceeds by first applying a masking material to all areas of the target 312 where adhesive is not desired (Step 404). The adhesive may then be applied to the target 312 (Step 406). A toothed trowel may be used to make a uniform thickness bond line across the entire target 312 surface (Step 408). The masking material may then be removed so that adhesive remains only on the portions of the target 312 where the bonding will occur (Step 410). The target 312 with adhesive is then placed into the lower chamber 330 (Step 412). The upper chamber 328 is then sealed to the lower chamber 330 by O-rings 332.

The adhesive may be degassed so that it can effectively bond to the backing plate 308 (Step 414). To degas the adhesive, a vacuum needs to be applied to pull the gas from the adhesive. In the apparatus 300, the adhesive is degassed by opening valve 318, leaving valve 316 open, and closing valve 314 to close the apparatus 300 from atmosphere. During the degassing, both the upper chamber 328 and lower chamber 330 are evacuated by the vacuum pump because both valves 316 and 318 are open. The apparatus 300 is evacuated to a base pressure. A window 302 is provided in the upper chamber 328 so that the degassing procedure can be observed. Table A shows the conditions of the valves for each stage of the process.

TABLE A

| Operation | Valve 314 | Valve 316 | Valve 318 | Comment |
|---|---|---|---|---|
| Start | Closed | Open | Closed | Vacuum Pump On |
| Degas Adhesive | Closed | Open | Open | Pump To Base Pressure |
| Apply Bonding Pressure | Open | Closed | Open | Vent Upper Chamber |
| Vent To Atmosphere | Open | Open | Closed | Vent Lower Chamber |

Once the adhesive has been degassed, the adhesive is ready for bonding. The lower chamber 330 and upper chamber 328 are vented to atmosphere. The upper chamber 328 is removed. Then, the metal mesh may be applied (Step 416). Then, the backing plate 308 may be placed into contact with the adhesive and metal mesh (Step 418). Bonding pressure may then be applied to the sputtering target 312 and backing plate 308 (Step 420).

The lower chamber 330 is sealed from the upper chamber 328 by O-rings 332 and the metal plate 306. The apparatus 300 begins to function by closing valve 318, opening valve 316, closing valve 314, and turning the vacuum pump 310 on. At the start of the procedure, the apparatus 300 is sealed from atmosphere by valve 314 and sealed from the vacuum by valve 318.

To apply the bonding pressure, valve 318 is opened, valve 316 is closed, and valve 314 is opened. By closing valve 316, the upper chamber 328 is shut off from the vacuum pump 310. Therefore, the upper chamber 328 is no longer being evacuated. By opening valve 314, the upper chamber 328 is now open to atmosphere and reaches atmospheric pressure. While the upper chamber 328 is open to atmosphere, the lower chamber 330 is still under vacuum. Because the upper chamber 328 is open to atmosphere and the lower chamber 330 is evacuated, a pressure difference exists between the two chambers. Because the lower chamber 330 is at a lower pressure than the upper chamber 328, the metal plate 306 will compress the backing plate 308 against the target 312, which is braced against the bottom wall of the lower chamber 330. In one embodiment, the lower chamber 330 will be evacuated to a pressure of less than about 10 Torr. In another embodiment, the lower chamber 330 is evacuated to a pressure of less than about 7 Torr.

The combination of compressing the backing plate 308 and target 312 along with evacuating the lower chamber 330 causes not only the target 312 and backing plate 308 to be compressed together, but also the removal of air pockets from within the adhesive and between the adhesive and the backing plate 308. The vacuum applied to the lower chamber 330 pulls the air from the adhesive as the backing plate 308 and target 312 are compressed together so that air pockets within the adhesive are virtually eliminated. Because the upper chamber 328 is at atmospheric pressure and the lower chamber 330 is evacuated to a pressure of below about 10 Torr, the metal plate 306 compresses the backing plate 308 and target 312 together under a uniform loading. The pressure within the upper chamber 328 is uniformly at atmospheric pressure. Likewise, the lower chamber 330 is uniformly at an evacuated pressure such as less than about 10 Torr. Therefore, the metal plate 306 is uniformly loaded as it compresses the backing plate 308 and target 312 together.

After the compressing is completed, the apparatus 300 is vented to atmosphere so that the target 312 and backing plate 308 can be removed (Step 422). Valve 318 is closed, valve 316 is opened, and valve 314 remains open. Therefore, both the upper chamber 328 and the lower chamber 330 are exposed to atmospheric pressure. The upper chamber 328 can be removed from the lower chamber 330 so that the target 312 with backing plate 308 can be removed from the apparatus 300. Following the compressing, the adhesive can be cured as discussed below.

Prior to the above processing, the target 312 and backing plate 308 should go through surface preparation sub-steps, such as sanding the edges of the target 312 and washing the surfaces of target 312 and backing plate 308 that will receive the bonding material. A layer of elastomeric adhesive is applied on the target 312 surface that will face the backing plate. In one embodiment, a layer of elastomeric adhesive can also be applied on the backing plate 308 surface that will face the target. The adhesive on the backing plate 308 can be degassed in the same manner as the adhesive on the target 312 that is discussed above. In one embodiment, the mesh (or an electrical and/or thermal conductor) is placed on the elastomeric adhesive layer applied on the backing plate.

The adhesive is cured by heating. In one embodiment, a heated liquid, such as water, or gas, such as $N_2$, is passed through the heating channel(s) formed in the backing plate 308. The adhesive is cured to prevent outgassing during PVD processing, which operates under high vacuum, e.g. $10^{-4}$ Torr. To prevent target and/or backing plate bowing, a low temperature curing is desired. In one embodiment, the adhesive will cure when exposed to a temperature between about 25 degrees Celsius to about 100 degrees Celsius. In another embodiment, the curing temperature range is between about 45 degrees Celsius to about 70 degrees Celsius. In yet another embodiment, the temperature range is between about 45 degrees Celsius to about 55 degrees Celsius.

Curing of elastomeric adhesives can be performed at room temperature, which will take a relatively long time (e.g., 1 day). Curing at higher temperature will shorten the curing time (e.g., 8 hours at 50 degrees Celsius). Elastomeric adhesive bonding has the advantage of low processing temperature (e.g., 25 degrees Celsius –100 degrees Celsius), compared to the processing temperature of indium bonding (e.g., about 200 degrees Celsius). This low processing temperature reduces the risk of bowing of target and bonding plate after bonding process.

The time between applying the elastomeric adhesive on the surface of target 312 and backing plate 308 and pressing the target 312 against the metal mesh and backing plate 308 should not be too long to ensure an effective bond. In one embodiment, the duration between adhesive application and pressing is kept at less than 12 hours. In another embodiment, the duration is kept at less than 6 hours. In yet another embodiment, the duration is kept at less than 2 hours.

The concept of the using a metal mesh as an electrical and/or thermal conductor can also be applied to other types of bonding. For example, a metal mesh can also be placed between two conductive adhesive layers. The concept of using metal mesh made from metal wires with diameters greater than 0.5 mm can also be used for target bonding for semiconductor wafer processing in PVD chambers. The concept of the invention can be applied to bond sputtering targets to manufacture flat panel displays, solar panels, or electronic devices.

While the invention has been described above in relation to a metal plate 306 that compresses the target 312 and backing plate 308 together, it is to be understood that any flexible bladder not made of metal can be used to accomplish the same purpose so long as the flexible bladder can effectively compress the target 312 and backing plate 308 together while also effectively sealing the upper and lower chambers 328, 330 from each other.

While the foregoing is directed to embodiments of the present invention, other and further embodiments of the invention may be devised without departing from the basic scope thereof, and the scope thereof is determined by the claims that follow.

I claim:

1. A method of bonding at least one sputtering target to a backing plate, comprising:
    applying an adhesive layer between the at least one sputtering target and the backing plate;
    positioning a metal mesh between the at least one sputtering target and the backing plate; and
    exposing the adhesive layer to a vacuum to remove air pockets from the adhesive by compressing the backing plate and the at least one sputtering target, the compressing consists of applying a vacuum while sandwiching the backing plate and the at least one sputtering target between a metal plate of a chamber and the bottom of the chamber by moving the metal plate.

2. The method of claim 1, wherein the adhesive is an elastomeric adhesive.

3. The method of claim 1, further comprising curing the adhesive, wherein the curing comprises heating the adhesive to a temperature of about 25 degrees Celsius to about 100 degrees Celsius.

4. The method of claim 1, further comprising degassing the adhesive.

5. The method of claim 1, further comprising:
    masking areas of the at least one sputtering target to define unmasked portions;
    applying the adhesive to the unmasked portions of the at least one sputtering target;
    smoothing the adhesive to create a uniform thickness of the adhesive across the at least one sputtering target;
    removing the masking;
    applying the metal mesh to the adhesive layer; and
    applying the backing plate to the adhesive.

6. The method of claim 5, wherein the at least one sputtering target comprises a plurality of sputtering target tiles.

7. The method of claim 1, wherein the metal mesh comprises copper.

8. A method of bonding at least one sputtering target to a backing plate in an apparatus, the apparatus comprising an upper chamber and a lower chamber, separated by a metal plate, the method comprising:
    positioning the at least one sputtering target and the backing plate within the lower chamber with, an adhesive therebetween, the backing plate and the at least one sputtering target are sandwiched between the metal plate and a lower chamber bottom wall;
    evacuating the lower chamber;
    venting the upper chamber to atmospheric pressure while the lower chamber is evacuated;
    moving the metal plate; and
    compressing the backing plate and at least one sputtering target with the metal plate.

9. The method of claim 8, wherein the adhesive is an elastomeric adhesive.

10. The method of claim 8, further comprising curing the adhesive, wherein the curing comprises heating the adhesive to a temperature of about 25 degrees Celsius to about 100 degrees Celsius.

11. The method of claim 8, further comprising degassing the adhesive.

12. The method of claim 8, further comprising:
    masking areas of the at least one sputtering target to define unmasked portions;
    applying the adhesive to the unmasked portions of the at least one sputtering target;
    smoothing the adhesive to create a uniform thickness of the adhesive across the at least one sputtering target;
    removing the masking;
    applying a metal mesh to the adhesive layer; and
    applying the backing plate to the adhesive.

13. The method of claim 12, wherein the metal mesh comprises copper.

14. The method of claim 8, wherein the at least one sputtering target comprises a plurality of sputtering target tiles.

15. The method of claim 8, wherein the lower chamber is evacuated to a pressure below about 10 Torr.

16. The method of claim 1, wherein the backing plate contacts the metal plate.

17. The method of claim 1, wherein the at least one sputtering target contacts the bottom to the chamber.

18. The method of claim 8, further comprising evacuating the upper chamber.

19. The method of claim 8, wherein the backing plate contacts the metal plate.

20. The method of claim 8, wherein the at least one sputtering target contacts the bottom of the chamber.

* * * * *

UNITED STATES PATENT AND TRADEMARK OFFICE
CERTIFICATE OF CORRECTION

PATENT NO. : 7,476,289 B2 Page 1 of 1
APPLICATION NO. : 11/478280
DATED : January 13, 2009
INVENTOR(S) : White It is certified that error appears in the above-identified patent and that said Letters Patent is hereby corrected as shown below:

On the Title Page Item (73):

Please delete "SAnta" and insert --Santa-- therefor;

Column 4, Line 49, please delete "chambers" and insert --chamber-- therefor;

Column 4, Line 50, please insert --the target-- after compresses;

Column 8, Claim 17, Line 45, please delete "to" and insert --of-- therefor.

Signed and Sealed this

Twenty-first Day of April, 2009

JOHN DOLL
*Acting Director of the United States Patent and Trademark Office*